United States Patent [19]
Newell

[11] B 4,006,645
[45] Feb. 8, 1977

[54] X, Y, θ ALIGNMENT MECHANISM

[75] Inventor: William H. Newell, Mount Vernon, N.Y.

[73] Assignee: The Perkin-Elmer Corporation, Norwalk, Conn.

[22] Filed: Sept. 26, 1974

[21] Appl. No.: 509,586

[44] Published under the second Trial Voluntary Protest Program on February 3, 1976 as document No. B 509,586.

[52] U.S. Cl. .............................................. 74/479
[51] Int. Cl.² .................................... G05G 11/00
[58] Field of Search .................................. 74/479

[56] References Cited
UNITED STATES PATENTS

| | | | |
|---|---|---|---|
| 3,626,769 | 12/1971 | Hecker et al. | 74/479 X |
| 3,691,864 | 9/1972 | Cochran et al. | 74/479 |
| 3,861,233 | 1/1975 | Miyamoto | 74/479 |

*Primary Examiner*—Allan D. Herrmann
*Attorney, Agent, or Firm*—S. A. Giarratana; F. L. Masselle; J. M. O'Meara

[57] ABSTRACT

An improved apparatus for obtaining X, Y and θ relative motion of an object in which four links pivotally connected in a parallelogram with the object forming one link thereof is used, with means provided to rotate a first of the links while holding stationary the adjacent link to produce a Y motion, and means to rotate one of said links to thereby rotate the arrangement, in each case, the motion being accomplished with negligible cross-coupling and in a manner which permits fine adjustments of the order of a micron with no lost motion.

10 Claims, 5 Drawing Figures

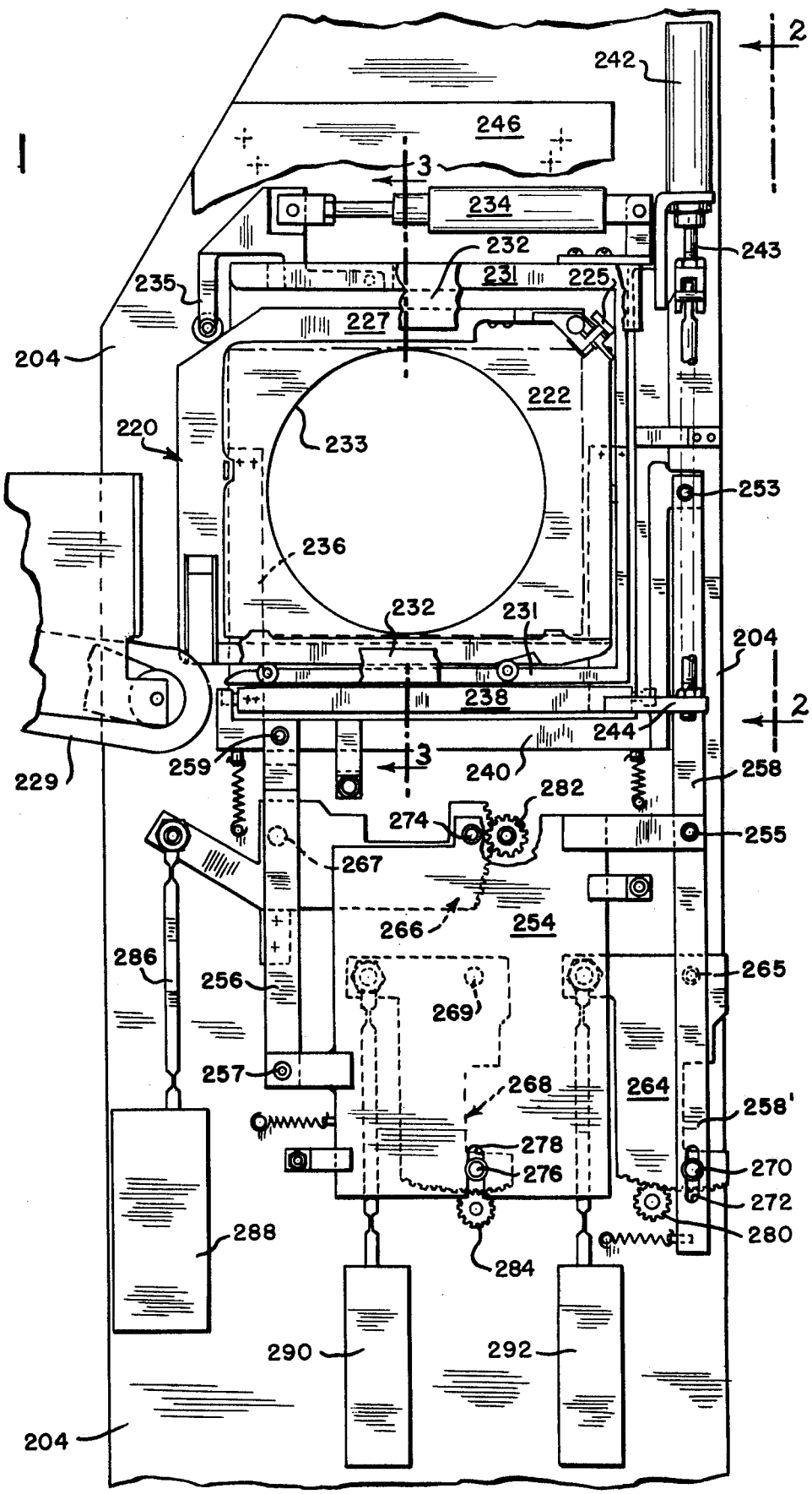
FIG. I

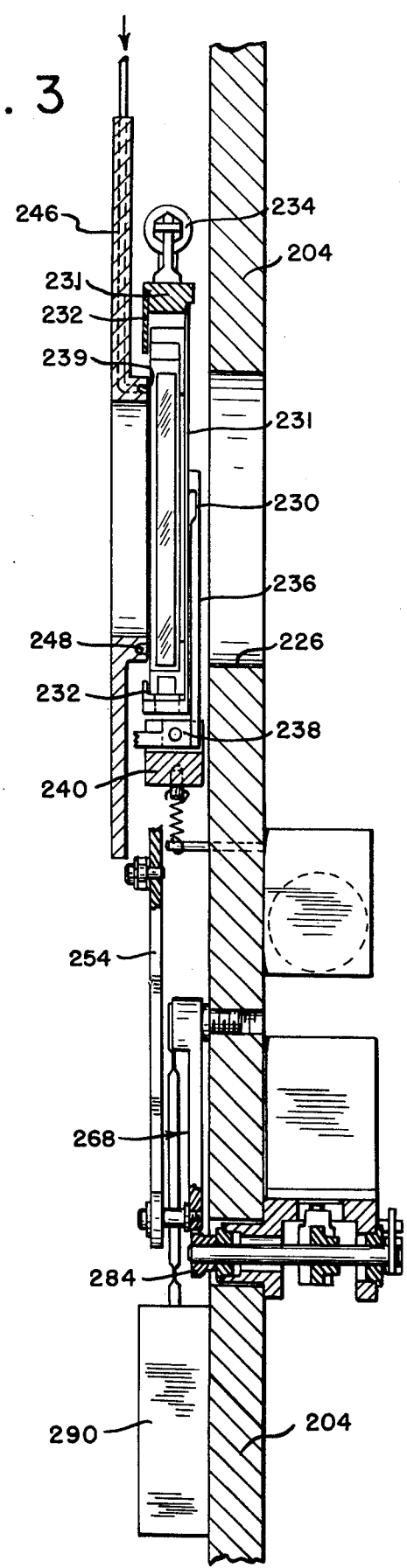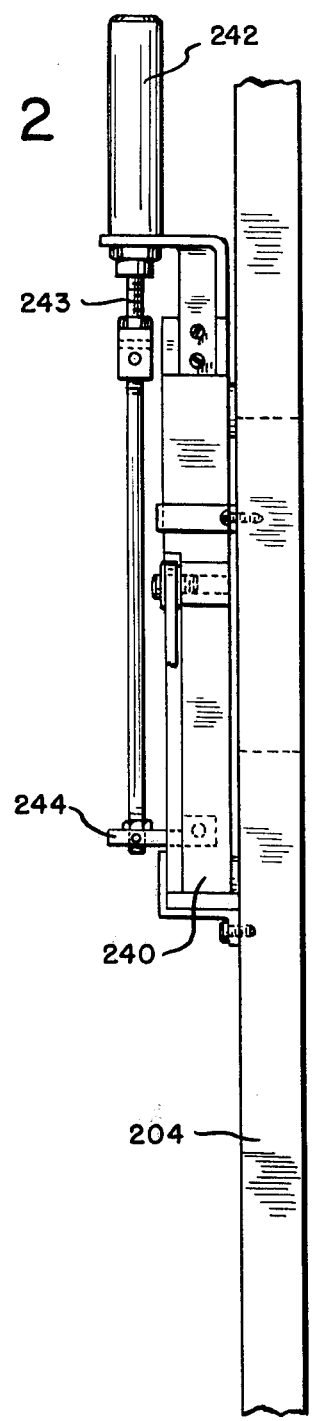

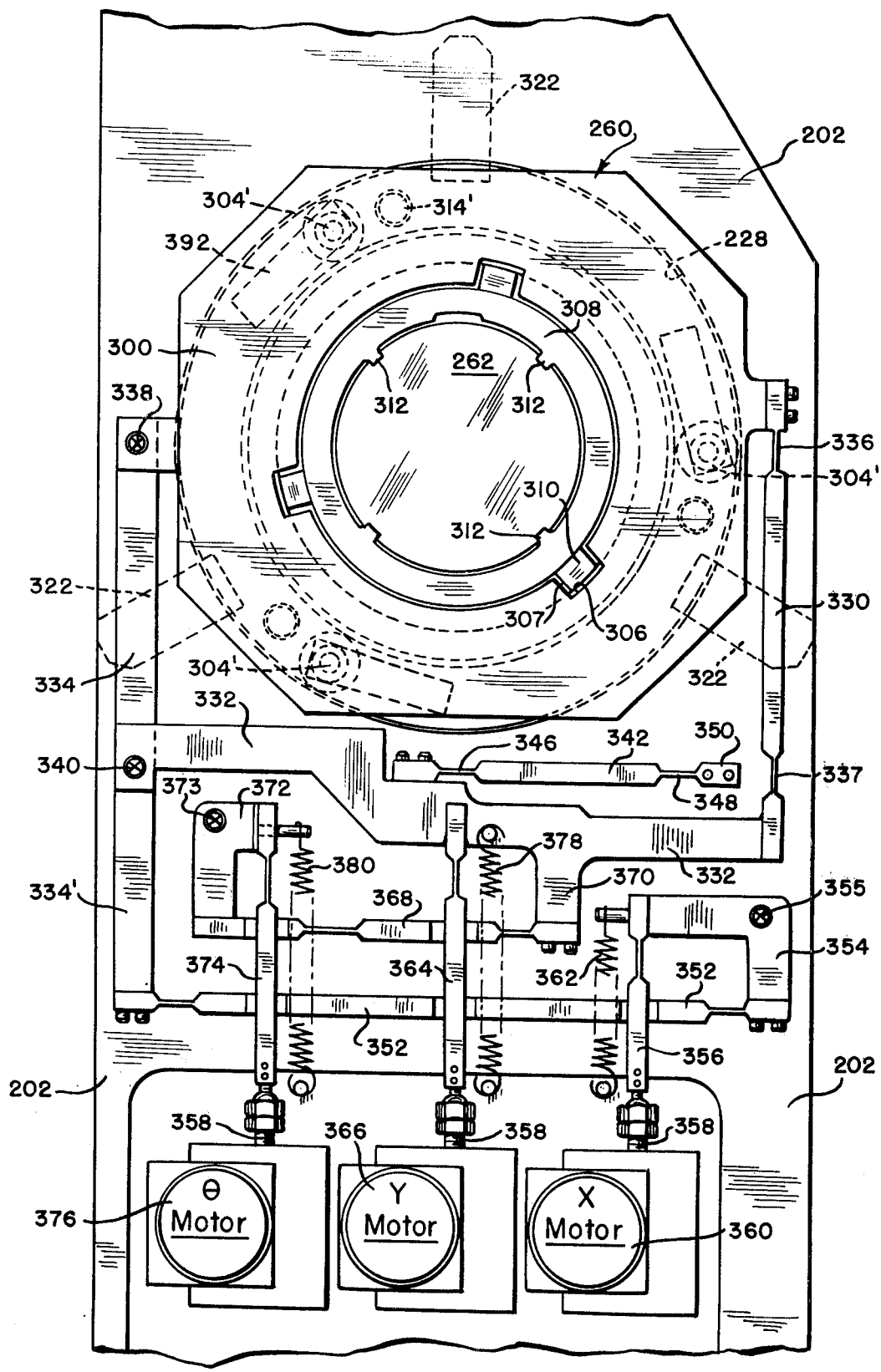

X, Y, θ ALIGNMENT MECHANISM

BACKGROUND OF THE INVENTION

This invention relates to alignment mechanisms in general, and more particularly to an improved X, Y, θ alignment mechanism, particularly useful in alignment of optical apparatus. In copending U.S. application, Ser. No. 339,860 filed Mar. 9, 1973 and assigned to the same assignee as the present invention, an optical projecting and scanning apparatus useful for producing integrated circuits is disclosed. In such an apparatus, the alignment between a mask and a wafer is required. That is to say, both the wafer and the mask must be translated in two orthogonal directions and rotated about their respective centers in order to align the wafer with the image of the mask. If such is not done without cross-coupling, the operator can become confused and alignment may take an undue amount of time. In addition, proper alignment requires very fine adjustment in the order of a micron.

Thus, it is the object of the present invention ot provide such an alignment mechanism which has negligible cross-coupling and which, at the same time, permits the fine adjustment required.

SUMMARY OF THE INVENTION

The present invention solves this problem through the use of four links pivotally connected in a parallelogram. In the application to the mask and wafer, both the mask and the wafer are supported for motion in such a manner. Although herein the mask and wafer arrangement is used as an example, it will be recognized that the adjustment apparatus can be used for other purposes. Thus, where herein the adjustment is of the mask or the wafer with respect to a fixed base, in general terms, the adjustment can be considered a relative adjustment between any two objects. In the disclosed embodiment, the mask is arranged for only coarse alignment. The wafer drive is arranged for fine adjustment and uses flexures to eliminate lost motion. However, in each case, motion is obtained through the use of four links pivotally connected in a parallelogram with the base of the mask or wafer support forming one link therein. In each case, this arrangement permits motions which are essentailly independent of each other to thereby permit ease of adjustment. In the wafer alignment apparatus, the required fine adjustment is then accomplished through the use of flexures as noted above.

BRIEF DESCRIPTION OF THE DRAWINGS

FIG. 1 is a diagrammatical view in elevation of one embodiment of the present invention for adjusting the mask stage in an optical projection and scanning apparatus.

FIG. 2 is a fragmentary view in elevation of the apparatus shown in FIG. 1 seen in the directions of the arrow 2—2 in FIG. 1.

FIG. 3 is a fragmentary sectional view taken on the line 3—3 of FIG. 1 shown together with a sectional view of means which define the plane of the mask.

FIG. 4 is an elevation view of a second embodiment of the present invention useful for adjusting the wafer stage in an optical projection and scanning apparatus.

DETAILED DESCRIPTION OF THE PREFERRED EMBODIMENT

Figure 5:
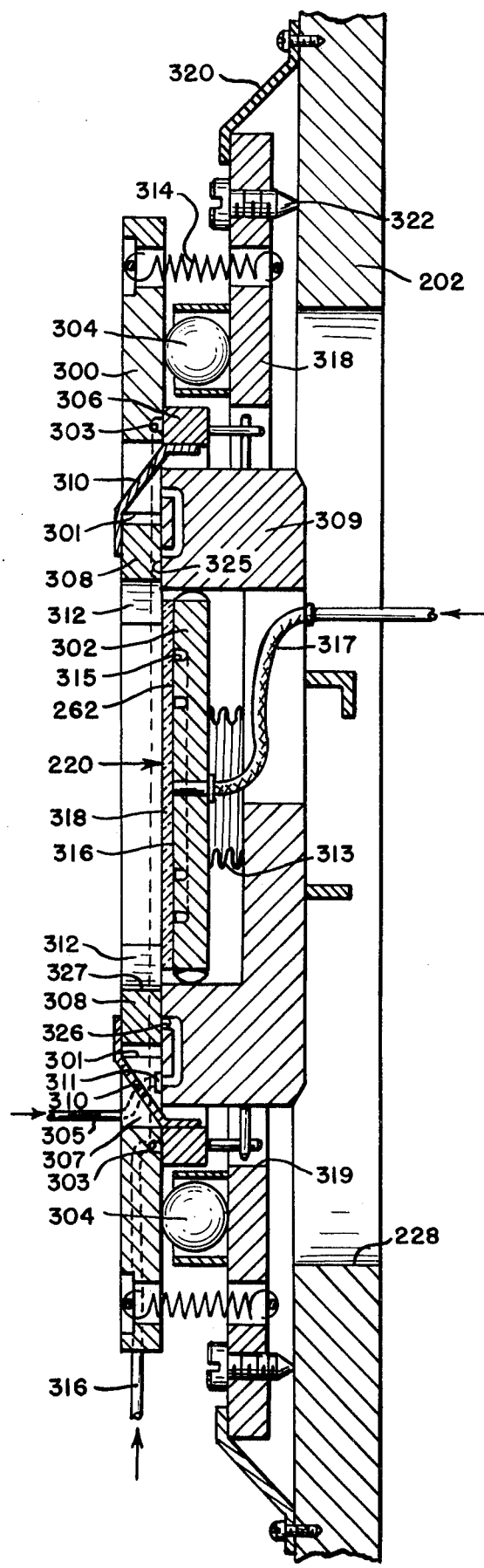
FIG. 5 is a diagrammatical sectional view of the arrangement of FIG. 4.

The present invention is disclosed as applied to an optical projection and scanning apparatus such as that disclosed and claimed in the aforementioned copending application. The invention will first be disclosed in an embodiment which permits coarse alignment. In the aforementioned patent application, the coarse alignment mechanism is used for adjusting the mask carrier. FIGS. 1, 2 and 3 illustrate this first embodiment.

The mask carrier bar 240 of the mask carrier constitutes part of the parallelogram motion mechanism of the present invention by means of which the mask can be moved independently in perpendicular X and Y directions, and also rotated, in planes parallel to the object focal plane defined by the rim 239 (FIG. 3) of the position-defining member 246. This parallelogram motion mechanism includes in addition to the bar 240, a plate 254 and two links 256 and 258. These are pivoted together at pivots 253, 255, 257 and 259. The spacing from 253 and 255 is the same as the spacing from 259 to 257 and the spacing from 259 to 253 is the same as the spacing from 257 to 255. Three gear sectors 264, 266 and 268 are pivoted to a plate 204 at 265, 267 and 269. A pin 270 on sector 264 engages an extension 258' of link 258 at a slot 272 in that extension. A pin 274 couples sector 266 to plate 254, and a pin 276 on sector 268 engages the plate 254 at a slot 278. Separate motors disposed on the side of plate 204 but not seen in FIG. 1 and selectively controlled from a control panel, rotate pinions 280, 282, and 284 which mesh with sectors 264, 266 and 268 respectively.

Plate 254 and hence the parallelogram comprising that plate, bar 240 and links 256 and 268, is coupled to plate 204, i.e., to "ground," through pivot 274 and sector 266. With pinions 282 and 284 stationary, plate 254 is stationary and rotation of sector 264 rotates link 258 about a stationary pivot at 255. Link 256 therefore rotates about a stationary pivot at 257, and bar 240 with the mask stage executes parallel motion along an arcuate circular path. For the small excursions required however, this motion is essentially horizontal in FIG. 1, and hence can be referred to as an X motion for the mask.

With pinions 280 and 284 stationary, the lower end of link 258 is constrained at pin 270 and slot 272 and the lower end of plate 254 is constrained at pin 276 and slot 278. Hence rotation of pinion 282 and sector 266 imposes on plate 254 a motion which is primarily an up and down motion in FIG. 1, and this is communicated, again, as an essentially up and down or Y motion, to bar 240 and thereby to the mask.

With pinions 280 and 282 stationary, rotation of sector 268 imposes on the plate 254 a rotation about a stationary pivot at 274. This rotation is permitted by slot 272 which moreover constrains link 285, so that this rotation of plate 254 is duplicated as a rotation of bar 240, and thereby of the mask, about a center in the mask. This motion can accordingly for convenience be referred to as an angular or θ motion.

A link 286 connects the sector 266 to a position sensing and/or limit switch device 288, and the sectors 268 and 264 are similarly coupled to position sensing and/or limit switch devices 290 and 292.

The manner in which the present invention also obtains fine motion will next be explained in an embodiment used as the wafer stage and motion mechanism in the aforementioned application. The position of the wafer must be more closely controlled than that of the mask. Especially when wafers are to be subjected to exposures subsequent to the first one, they must be very exactly positioned, so that the successive exposures will be in the correct relative positions. The wafer stage is therefore constructed to permit highly accurate positioning of the wafers.

FIG. 4 is a fragmentary view in elevation of a fixed carriage plate 202. In FIG. 4, a wafer 262 is shown supported over the aperature 228 in plate 202, by elements of structure to be described in connection with FIG. 5, at the center of an apertured plate 300 which constitutes one limb of a parallelogram motion mechanism, capable of imposing independent closely controlled X, Y and θ motions on the wafer in accordance with the present invention.

FIGS. 4 and 5 also illustrate the manner in which the wafer is supported. Since this does not constitute a portion of the present invention, these specific support mechanisms will not be described.

Plate 300 constitutes one side of a parallelogram mechanism similar to that shown in FIG. 1. The other sides of the parallelogram comprise a link 330, a bar 332, and a bar 334. Link 330 is joined at its ends to plate 300 and to bar 332 by means of flexure pivots 336 and 337 respectively. Bar 334 is coupled to plate 300 and to bar 332 at pivots 338 and 340 which may take the form of crossed flexure blades, similar to those disclosed in the aforementioned patent application U.S. Ser. No. 339,860 in connection with FIG. 8 thereof although of smaller size. The spacing of 338 from 340 is the same as the spacing from 336 to 337, and the spacing from 336 to 338 is the same as the spacing from 337 to 340. At or near its mid-point, bar 332 is coupled to ground, i.e., to plate 202, through a link 342 having flexure points 346 and 348 at its ends, the latter connecting to a block 350 anchored to plate 202.

An extension 334' on bar 334 connects via link 352, similar to the link 342, with a bell crank 354 pivoted at 355 to plate 202. A push rod link 356 couples bell crank 354 to the linearly movably actuating rod 358 of a motor 360. A spring 362 coupled between bell crank 354 and plate 202 urges the bell crank in a counterclockwise direction, as viewed in FIG. 4.

A push rod link 364 couples bar 332 to the actuating rod 358 of a second motor 366. A link 368, similar to the link 342, couples bar 332 at an extension 370 thereof with a bell crank 372 pivoted to plate 202 at 373, and a push rod 374 couples the bell crank to a third motor 376. Springs 378 and 380 respectively draw bar 332 downwardly and impose a clockwise bias on bell crank 372.

With the motors 366 and 376 stationary, bar 332, corresponding to the plate 254 of FIG. 1, is held stationary. Motion of the motor 360 shifts link 352 horizontally, thereby rotating link 334 about a stationary pivot at 340. This imposes on plate 300 a parallel arcuate motion which for the small excursions involved is essentially a horizontal motion in FIG. 4 and which can therefore be described as an X motion for the wafer.

With motors 360 and 376 stationary, motion of the motor 366 imposes on the plate 300 an essentially linear motion which is vertical as seen in FIG. 4, and which can therefore be described as a Y motion. With motors 360 and 366 stationary, motion of the motor 376 imposes on plate 300 a rotational motion which can therefore be described as an angular or θ motion.

Position sensors and/or limit switches, similar to the devices 288, 290 and 292 of FIG. 1, may be provided in association with push rods 364, 374 and 356. Like the motors which rotate the pinions 280, 282, and 284 of FIG. 1, motors 360, 366 and 376 of FIG. 4 are selectively controlled. The use of the flexures rather than gears in this embodiment permits the finer control of motion necessary.

Thus, an improved apparatus for obtaining X, Y, and θ motion with practically no cross-coupling has been shown. Although specific embodiments have been illustrated and described, it will be obvious to those skilled in the art that various modifications may be made without departing from the spirit of the invention which is intended to be limited solely by the appended claims.

What is claimed:

1. Positioning apparatus for positioning an object with respect to a fixed base comprising:
   four links (240, 254, 256, 258; 300, 332, 330, 334) pivotally interconnected at points (253, 255, 257, 259; 338, 340, 337, 336) located at the corners of a parallelogram, a first link (240, 300) of said parallelogram supporting an object to be moved;
   means to rotate a second link (254, 332) that is opposite said first link in said parallelogram and that is coupled to the base (204, 202);
   means to translate said second link (254, 332) of said parallelogram; and
   means to rotate a third link (258, 334) in said parallelogram, said links being interconnected with said second link (254, 332) so that rotation of said second link in said parallelogram rotates said object, so that translation of said second link in said parallelogram translates said object in a first direction and so that rotation of said third link in said parallelogram translates said object in a direction substantially normal to said first direction.

2. Positioning apparatus as in claim 1 wherein said second link (254, 332) is coupled to said base (204) through a first gear sector (266) having one end pivotally connected by a pin (274) to said second link and the other end pivotally connected to said base, said first gear sector engaging a first pinion (282) said first pinion and first gear sector being the means to translate said second link, said apparatus further including:
   a second gear sector (268) having a first end pivotally coupled to said base and a second end pivotally coupled to said second link by means of a pin (276) engaging an elongated slot (278) therein;
   second pinion (284) engaging said second gear sector (268) said second pinion and second gear sector being the means to rotate said second link; and
   a third gear sector (264) having one end pivoted to said base and another end pivotally coupled to said third link (258) through a pin (270) engaging an elongated slot (272) therein, a third pinion (280) engaging said third gear sector, said third pinion and third gear sector being said means to rotate said third link.

3. Positioning apparatus according to claim 2 and further including first, second and third position sensing means (288, 290, 292) coupled to said first, second and third gear sectors (266, 268, 264) respectively.

4. Positioning apparatus according to claim 3 wherein said gear sectors are coupled to said position sensing means through flexure couplings.

5. Positioning apparatus according to claim 1 wherein said first link (300) is coupled to said third link (334) and said third link is coupled to said second link (332) by pivots in the form of crossed flexure blades (338, 340); said first link and said second link being coupled by a fourth link (330) in the form of a flexure bar having first and second flexure pivots (336, 337) adjacent first one and said second links respectively; said second link being coupled to said base (202) through a second flexure bar (342) having flexure pivots (346, 348) at its end adjacent said second link and said base respectively; a first bell crank (354) pivoted to said base, and a third flexure bar (352) having flexure pivots on each end coupling one end of said first bell crank to said third link (334); first driving means (360), and a first rod (356) coupling the other end of said first bell crank (354) to said first driving means; the arrangement comprising said first bell crank (354), said third flexure bar, said first rod and said first driving means being said means to rotate said third link; a second bell crank (372) pivoted to said base, and a fourth flexure bar (368) having flexure pivots on both ends coupling one end of said second bell crank (372) to said second link (332); second driving means (376), and a second rod (374) having a flexure pivot on its one end coupling the other end of said second bell crank to said second driving means; said second bell crank, fourth flexure bar, second rod and second driving means being said means to rotate said second link; a third rod (364) and a third driving means (366), said third rod coupling said second link (332) to said third driving means, said third rod and third driving means being said means to translate said second link.

6. Apparatus according to claim 5 wherein said first and second links (300, 332) are essentially horizontal, while said third and fourth links (334, 330) are substantially vertical; said third flexure bar (352) being arranged substantially horizontal and being coupled to a vertical extension (334') of said third link, with the other end of said first bell crank (354) being coupled to a substantially vertical first rod (356); said second flexure bar (342) being substantially horizontal, and said fourth flexure bar (368) being substantially horizontal and coupling a vertical extension (370) of said second link to said second bell crank (372), with the other end of said second bell crank being coupled to said second driving means by a substantially vertical second rod (374); and said third rod (364) coupling said second link (332) to said third driving means (366) being substantially vertical.

7. Apparatus according to claim 6 wherein said second flexure bar (342) is attached to said second link (332) essentially near the center of said second link.

8. Positioning apparatus according to claim 7 wherein said first, second and third driving means (360, 376, 366) comprise first, second and third motors coupled for applying a substantially linear motion to said first second and third rods (356, 374, 364) respectively.

9. Positioning apparatus according to claim 5 wherein the spacing between said crossed flexure blades (338, 340) coupling the third link (334) to the first and second links (300, 332) is substantially equal to the spacing of the flexure pivots (336, 337) at the ends of the fourth link (330), and the spacing between said crossed flexure blade (338) coupling said first linke (300) and said third link (334) and the flexure pivot (336) coupling said fourth link (330) to said first link (300) is substantially equal to the distance between the cross flexure blade (340) coupling said second and third links (332, 334) and the flexure pivot (337) coupling the fourth link (330) to said second link (332).

10. Positioning apparatus according to claim 9 and further including a first spring (362) parallel to said first rod (356) biasing said first bell crank (354) downward, a second spring (380) parallel to said second rod (374) biasing said second bell crank (372) downward and a third spring (378) parallel to said third rod (364) biasing said second link (332) downward.

* * * * *